(12) United States Patent
Liu

(10) Patent No.: US 12,010,254 B2
(45) Date of Patent: Jun. 11, 2024

(54) MOTION MECHANISM APPLIED TO INNER FOLDING FLEXIBLE SCREEN TERMINAL AND INNER FOLDING FLEXIBLE SCREEN TERMINAL

(71) Applicant: AMPHENOL PHOENIX (ANJI) TELECOM PARTS CO., LTD., Zhejiang (CN)

(72) Inventor: Xiaojie Liu, Zhejiang (CN)

(73) Assignee: AMPHENOL PHOENIX (ANJI) TELECOM PARTS CO., LTD., Zhejiang Province (CN)

( * ) Notice: Subject to any disclaimer, the term of this patent is extended or adjusted under 35 U.S.C. 154(b) by 243 days.

(21) Appl. No.: 17/620,593

(22) PCT Filed: Jun. 11, 2020

(86) PCT No.: PCT/CN2020/095504
§ 371 (c)(1),
(2) Date: Dec. 17, 2021

(87) PCT Pub. No.: WO2020/253601
PCT Pub. Date: Dec. 24, 2020

(65) Prior Publication Data
US 2022/0345558 A1    Oct. 27, 2022

(30) Foreign Application Priority Data
Jun. 20, 2019   (CN) .......................... 201920937670.4

(51) Int. Cl.
*H05K 5/02* (2006.01)
*F16C 11/04* (2006.01)
(Continued)

(52) U.S. Cl.
CPC ........... *H04M 1/0268* (2013.01); *F16C 11/04* (2013.01); *H05K 5/0018* (2022.08); *H05K 5/0226* (2013.01)

(58) Field of Classification Search
CPC ..... H04M 1/0268; H04M 1/022; F16C 11/04; H05K 5/0018; H05K 5/0226; G06F 1/16
See application file for complete search history.

(56) References Cited

U.S. PATENT DOCUMENTS 11,336,759 B2 * 5/2022 Liao ....................... H04M 1/021
11,487,321 B2 * 11/2022 Cheng ................... H04M 1/022
(Continued)

FOREIGN PATENT DOCUMENTS

CN    107654484 A    2/2018
CN    108924296 A    11/2018
(Continued)

*Primary Examiner* — Anthony Q Edwards
*Assistant Examiner* — Hung Q Dang
(74) *Attorney, Agent, or Firm* — MUNCY, GEISSLER, OLDS & LOWE, P.C.

(57) ABSTRACT

A motion mechanism applied to an inner folding flexible screen terminal and an inner folding flexible screen terminal are disclosed. The motion mechanism includes left and right cranks and left and right connecting plates. The left and right cranks are both rotatably connected to a middle support structure, and the left and right connecting plates are respectively rotatably connected to the left and right cranks and slidably connected to left and right support frames. The left and right connecting plates are respectively connected to left and right housings of the flexible screen terminal. The motion mechanism has a simple structure and reliable movements. When the flexible screen is bent, the housings and the flexible screen move toward the far side together. In addi- (Continued)

tion, the housings do not need to be provided with overly wide frames at two ends for coverage, which may facilitate a narrow frame design.

10 Claims, 4 Drawing Sheets

(51) Int. Cl.
*H04M 1/02* (2006.01)
*H05K 5/00* (2006.01)

(56) References Cited

U.S. PATENT DOCUMENTS

| | | | | |
|---|---|---|---|---|
| 11,516,931 B2* | 11/2022 | Kim | ....................... | G06F 1/1652 |
| 11,630,491 B2* | 4/2023 | Huang | ................... | G06F 1/1616 |
| | | | | 361/679.01 |
| 11,644,873 B2* | 5/2023 | Hsu | ....................... | G06F 1/1681 |
| | | | | 361/679.27 |

FOREIGN PATENT DOCUMENTS

| | | |
|---|---|---|
| CN | 208353382 U | 1/2019 |
| CN | 109872630 A | 6/2019 |
| CN | 210640914 U | 5/2020 |
| EP | 3422141 A1 | 1/2019 |

\* cited by examiner

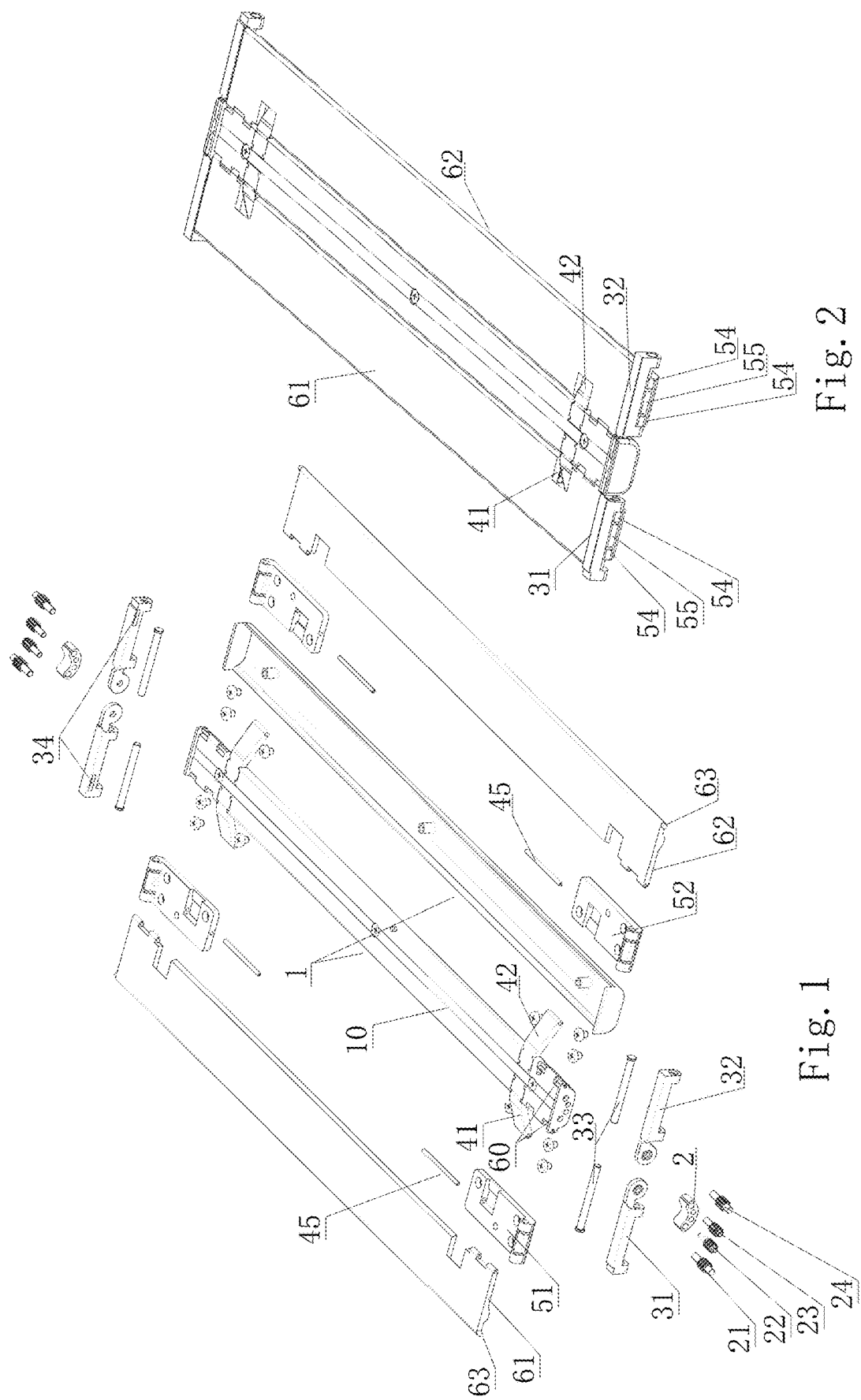

MOTION MECHANISM APPLIED TO INNER FOLDING FLEXIBLE SCREEN TERMINAL AND INNER FOLDING FLEXIBLE SCREEN TERMINAL

TECHNICAL FIELD

The present invention relates to an inner folding flexible screen mobile terminal and a hinge thereof.

BACKGROUND

For a conventional inner folding flexible screen mobile terminal, in order to improve the protection of the flexible screen when a flexible screen terminal is folded, left and right parts thereof and a housing of the flexible screen terminal are in a slidable cooperation state, however, this is unfavorable for a narrow frame design.

SUMMARY

The present invention aims to solve the technical problem of providing a motion mechanism applied to an inner folding flexible screen terminal, which both improves the protection of a flexible screen when a flexible screen terminal is folded, and facilitates a narrow frame design. For this purpose, the present invention adopts the following technical solutions:

A motion mechanism applied to an inner folding flexible screen terminal, comprising a middle support structure, wherein the middle support structure is provided with a flexible screen support surface; the middle support structure is connected to left and right support frames through a synchronization mechanism; the motion mechanism is also provided with left and right cranks and left and right connecting plates; the left and right cranks are both rotatably connected to the middle support structure; the left and right connecting plates are respectively rotatably connected to the left and right cranks and respectively slidably connected to the left and right support frames; and the left and right connecting plates are respectively provided with connecting positions of left and right housings of the flexible screen terminal.

Positions of rotation centers of the left crank and the left support frame are configured such that in the course that the flexible screen terminal is unfolded to folded, the left connecting plate moves toward a direction far away from the middle support structure, and in the course from being folded to unfolded, the left connecting plate moves toward the middle support structure.

Positions of rotation centers of the right crank and the right support frame are configured such that in the course that the flexible screen terminal is unfolded to folded, the right connecting plate moves toward a direction far away from the middle support structure, and in the course from being folded to unfolded, the right connecting plate moves toward the middle support structure.

Further, rotation centers of the left and right cranks are both higher than the flexible screen support surface of the middle support structure and are close to or at the height of a neutral layer of the flexible screen.

On the basis of the technical solutions, the present invention can also adopt the following further technical solutions, or combines and uses the further technical solutions:

The motion mechanism is also provided with left and right movable support plates; the left and right movable support plates are respectively rotatably connected to left and right sides of the upper side of the middle support structure; and the left and right movable support plates are also respectively movably connected to the left and right support frames, and provide support for the left and right movable support plates when the flexible screen terminal is unfolded.

The motion mechanism is also provided with the left and right movable support plates. Outer side ends of the left and right cranks respectively extend below the left and right movable support plates. The left and right connecting plates are also respectively below the left and right movable support plates.

Rotation centers of the left and right support frames are lower than the flexible screen support surface.

Positions of the rotation centers of the left and right support frames in left and right directions are closer to the middle line of the middle support structure than the rotation centers of the left and right cranks.

Slidable guide structures are arranged between the left support frame and the left connecting plate and between the right support frame and the right connecting plate.

The slidable guide structures comprise guide shafts and guide sleeves matched with the guide shafts.

The motion mechanism is also provided with a structure for increasing resistance when the flexible screen terminal is rotatably unfolded and folded.

The motion mechanism is also provided with the structure for increasing the resistance when the flexible screen terminal is rotatably unfolded and folded. The structure for increasing the resistance is arranged at the slidable guide structures, to provide friction resistance for forward and backward sliding.

The guide structures comprise guide shafts and guide sleeves matched with the guide shafts. The structure for increasing the resistance comprises reed pipes. The reed pipes are respectively connected to the left and right connecting plates. The guide shafts are connected to the left and right support frames. The reed pipes tightly clamp the guide shafts.

Another object of the present invention is to provide an inner folding flexible screen terminal to which the motion mechanism is applied. For this purpose, the present invention adopts the following technical solutions:

An inner folding flexible screen terminal, comprising a flexible screen, left and right housings and the motion mechanism applied to the inner folding flexible screen terminal, wherein the left housing is connected to the left connecting plate; the right housing is connected to the right connecting plate; the flexible screen is fixedly connected to the left and right housings respectively; and the flexible screen is supported by support plates in the left and right housings on both sides when the flexible screen terminal is unfolded.

The present invention has a simple structure and reliable movements. When the flexible screen is bent, the housings and the flexible screen move toward the far side together, thus reducing the stress on the flexible screen and improving the protection of the flexible screen when the flexible screen terminal is folded. In addition, the housings do not need to be provided with overly wide frames at two ends for coverage, which may facilitate a narrow frame design.

BRIEF DESCRIPTION OF THE DRAWINGS

FIG. 1 shows an exploded view of an embodiment of a motion mechanism provided by the present invention;

FIG. 2 shows a schematic diagram of an embodiment of a motion mechanism provided by the present invention;

DETAILED DESCRIPTION

Figure 4:
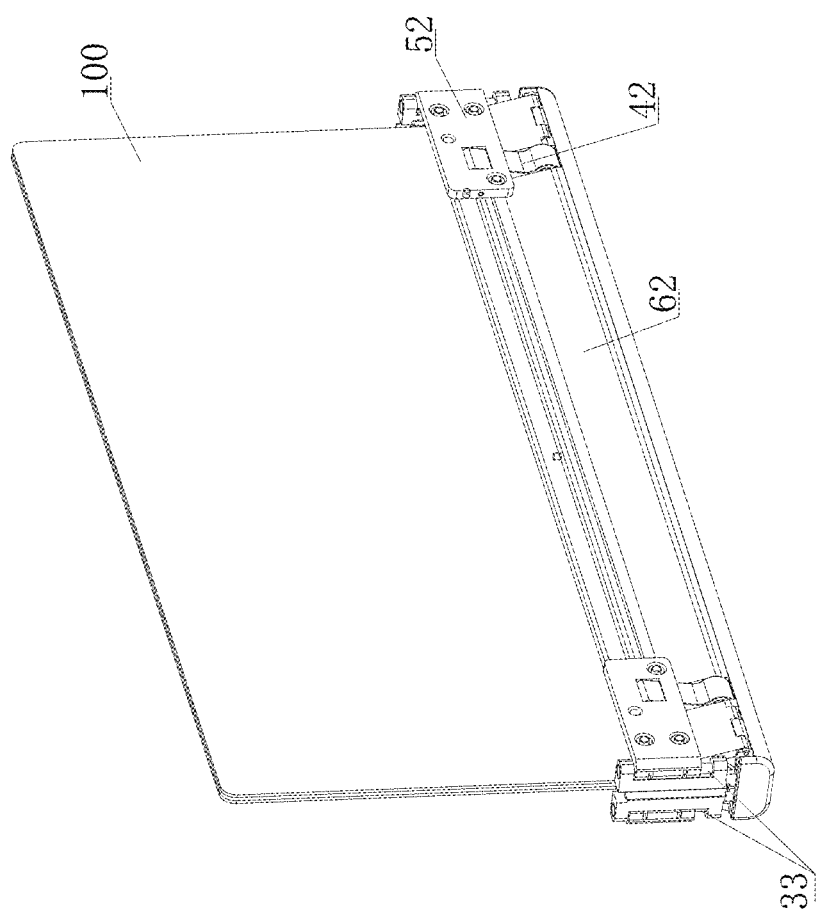
FIG. 4 shows a schematic diagram of an embodiment of a motion mechanism provided by the present invention in a folded state.
Figure 3:
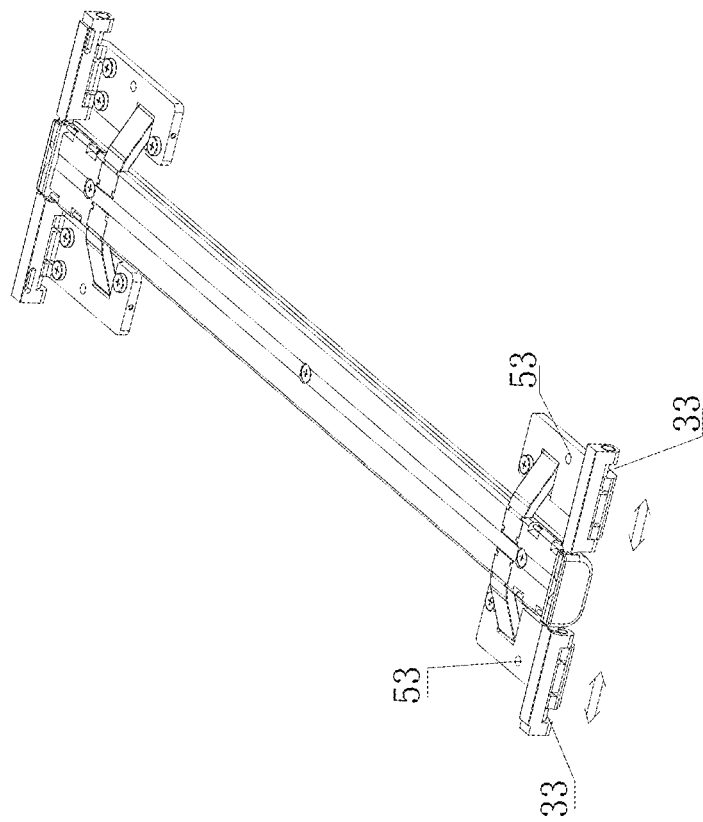
FIG. 3 shows a schematic diagram of an embodiment of a motion mechanism with left and right movable plates are hidden in an unfolding state provided by the present invention.
Figure 5:
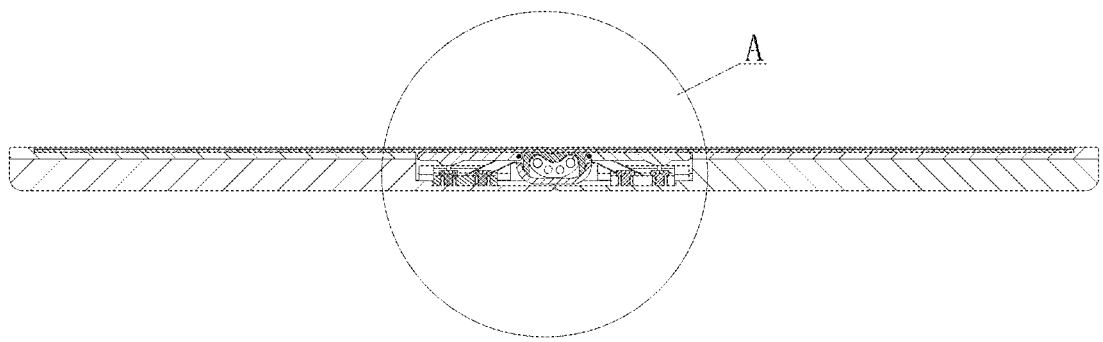
FIG. 5 shows a sectional view of a flexible screen terminal provided by the present invention in an unfolded state.
Figure 6:
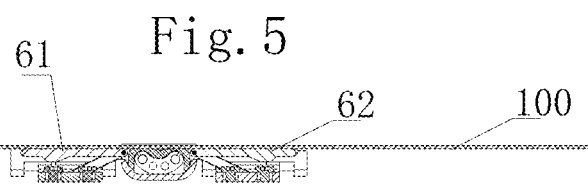
FIG. 6 shows a schematic diagram of the embodiment shown in FIG. 4 in an unfolded state.
Figure 7:
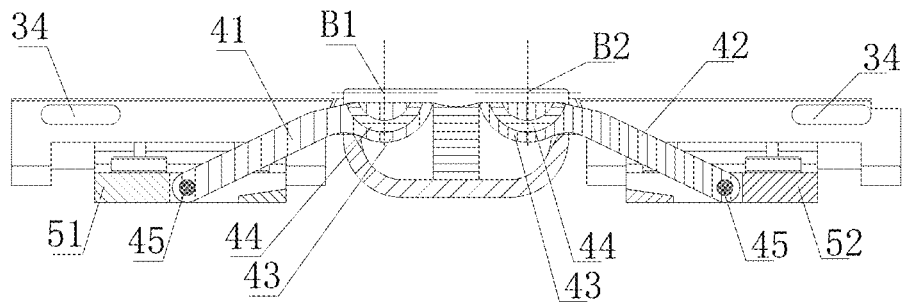
FIG. 7 shows an enlarged view of part A in FIG. 5.

Referring to the figures, a motion mechanism applied to an inner folding flexible screen terminal, provided by the present invention, comprises a middle support structure 1, wherein the middle support structure is provided with a support framework; the outer surface thereof is a decorative surface; a flexible screen support surface 10 is arranged on the top surface thereof; and the middle support structure is connected to left and right support frames 31 and 32 through a synchronization mechanism, to enable the left and right support frames 31 and 32 to rotate synchronously in opposite directions.

The motion mechanism is also provided with left and right cranks 41 and 42 and left and right connecting plates 51 and 52. The left and right cranks 41 and 42 are both rotatably connected to the middle support structure. The left and right connecting plates 51 and 52 are respectively rotatably connected to the left and right cranks 41 and 42 through a shaft 45; and the left and right connecting plates 51 and 52 are respectively slidably connected to the left and right support frames 31 and 32.

Positions of rotation centers of the left crank 41 and the left support frame 31 are configured such that in the course that the flexible screen terminal is unfolded to folded, the left connecting plate 51 (driving a left housing 71) is driven to move toward a direction far away from the middle support structure 1, and in the course from being folded to unfolded, the left connecting plate 51 (driving the left housing 71) moves toward the middle support structure 1.

Positions of rotation centers of the right crank 42 and the right support frame 32 are configured such that in the course that the flexible screen terminal is unfolded to folded, the right connecting plate 52 (driving a right housing 72) is driven to move toward a direction far away from the middle support structure 1, and in the course from being folded to unfolded, the right connecting plate 52 (driving the right housing 72) moves toward the middle support structure 1.

Rotation centers B1 and B2 of the left and right cranks 41 and 42 are both higher than a flexible screen support surface 10 of the middle support structure 1 and are close to or at the height of a neutral layer of the flexible screen. The height of the neutral layer of the flexible screen refers to a height in a position where the flexible screen is neither extended nor shortened when being bent and unfolded in a thickness direction of the flexible screen. The left and right cranks 41 and 42 can be both connected through an arc-shaped sliding block 43 and an arc-shaped guide track 44 on the middle support structure 1. Circle centers of the arc-shaped sliding block 43 and the arc-shaped guide track 44 are both higher than the flexible screen support surface 10 of the middle support structure. When the flexible screen terminal is unfolded, the height of the arc-shaped sliding block 43 is not greater than that of the flexible screen support surface 10.

The left and right connecting plates 51 and 52 are respectively provided with connecting positions of the left and right housings 71 and 72 of the flexible screen terminal, for example, a plurality of screw connecting positions 53.

The motion mechanism is also provided with left and right movable support plates 61 and 62. The left and right movable support plates are respectively rotatably connected to left and right sides of the upper side of the middle support structure 1. The number 60 of the drawings is a connecting shaft. The left and right movable support plates 61 and 62 are also respectively movably connected to the left and right support frames 31 and 32. The left and right support frames 31 and 32 are provided with guide limiting holes 34. The left and right movable support plates 61 and 62 are provided with guide pins 63 matched with the guide limiting holes 34. When the flexible screen terminal is unfolded, the guide pins 63 are supported by hole walls of the guide limiting holes 34.

The left and right cranks 41 and 42 are bent downwards. Outer side ends thereof respectively extend below the left and right movable support plates 61 and 62 and are connected to the left and right connecting plates 51 and 52 through the shaft 45. The left and right connecting plates 51 and 52 are also respectively below the left and right movable support plates 61 and 62.

The synchronization mechanism may be a gear connection structure, which comprises a gear connecting frame 2. The gear connecting frame 2 is arranged at an end part of the middle support structure 1. The synchronization mechanism is provided with 4 gears 21, 22, 23 and 24 which are sequentially connected in a meshed manner. Gear shafts of the gears 21 and 24 are respectively connected with the left and right support frames 31 and 32, as rotation centers of the left and right support frames 31 and 32. The rotation centers of the left and right support frames are lower than the flexible screen support surface 10. Positions of the rotation centers of the left and right support frames in left and right directions are closer to the middle line of the middle support structure 1 than the rotation centers of the left and right crank 41 and 42, or in positions in the left and right directions, the positions of the rotation centers of the left and right cranks 41 and 42 are on an outer side when compared with those of the rotation centers of the left and right support frame 31 and 32.

Slidable guide structures are arranged between the left support frame 31 and the left connecting plate 51 and between the right support frame 32 and the right connecting plate 52.

The slidable guide structures comprise guide shafts 33 and guide sleeves 54 matched with the guide shafts 33. The guide sleeves are arranged on lateral sides of the left and right connecting plates 51 and 52.

Figure 8:
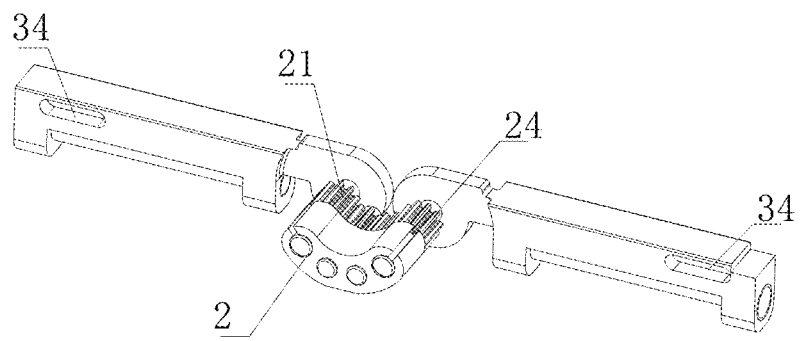
FIG. 8 shows a schematic diagram of combination of left and right mounting frames and a synchronization mechanism in the embodiment shown in FIG. 1.
Figure 9:
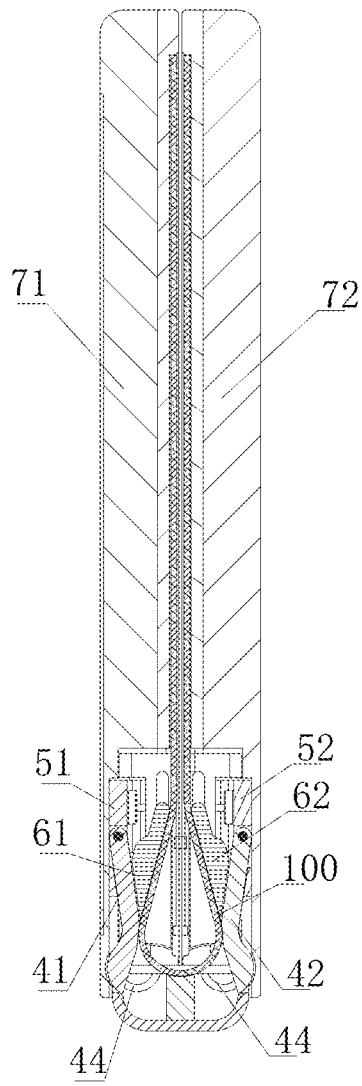
FIG. 9 shows a sectional view of a flexible screen terminal provided by the present invention in a folded state.
Figure 10:
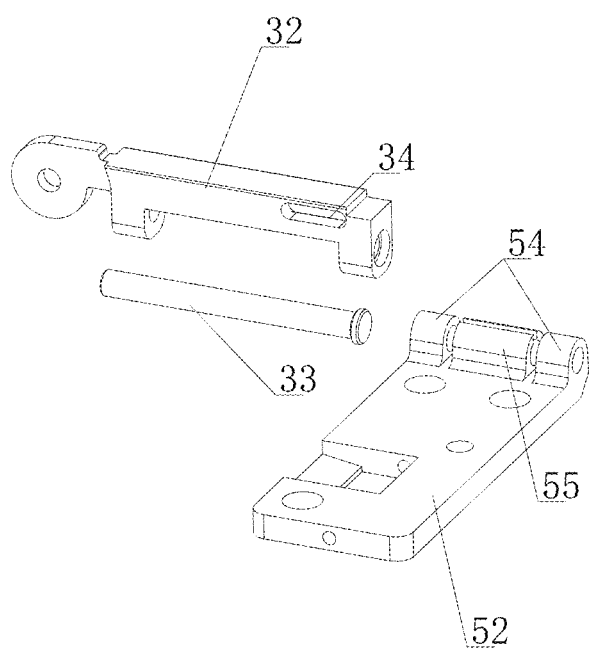
FIG. 10 shows a schematic diagram of slidable connection of a connecting plate and a support frame in a flexible screen terminal provided by the present invention.

The motion mechanism is also provided with a structure for increasing resistance when the flexible screen terminal is rotatably unfolded and folded. The structure may be used to provide functions of stopping rotation and positioning at any time or only a function of providing operation hand feelings. As shown in FIG. 8, the structure may be set through the synchronization mechanism, that is, holes of gear shafts of corresponding gears 21 and 24 of a gear connecting frame 2 are set as a reed pipe structure, and the gear shafts of the gears 21 and 24 are tightly clamped by the reed pipe structure, to provide the resistance.

Preferably, the structure for increasing the resistance may be arranged at the slidable guide structure. The structure comprises reed pipes 55. The reed pipes 55 are respectively connected to lateral sides of the left and right connecting plates 51 and 52. The guide sleeves 54 are respectively arranged before and after the reed pipes 55. The guide shafts 33 are respectively connected to the left and right support frames. The reed pipes tightly clamp the guide shafts. In this way, gaps of the structure can be well eliminated, the quality can be improved, and meanwhile, the resistance can be simple and convenient to adjust.

When the mobile mechanism is applied to the inner folding flexible screen terminal, the flexible screen 100 is on the inner side of the mobile terminal, the left housing 71 and the left connecting plate 51 are connected through screws, the right 72 is connected to the right connecting plate 52, and the flexible screen is fixedly connected to the left and right housings 71 and 72 respectively. When the flexible screen terminal is unfolded, both sides are supported by support plates in the left and right housings, the flexible screen support surface 10 is arranged in the middle, and parts therebetween may be supported by the left and right movable support plates 61 and 62. When the flexible screen terminal is folded from the unfolded state, both ends of the flexible screen can respectively move with the left and right housings 71 and 72, instead of moving oppositely, so that widths of frames at both ends of the housings do not need to be increased to cover gaps resulting from extension and withdrawing of the flexible screen.

The foregoing description is only for the specific embodiments of the present invention, but the structural features of the present invention are not limited thereto. It is foreseeable that the motion mechanism of the present invention can be applied to various flexible screen mobile terminals. Any and all changes or modifications made by those skilled in art in the field of the present invention shall fall within the scope of protection of the present invention.

The invention claimed is:

1. A motion mechanism applied to an inner folding flexible screen terminal, comprising a middle support structure, wherein the middle support structure is provided with a flexible screen support surface, the middle support structure is connected to left and right support frames through a synchronization mechanism, the motion mechanism is also provided with left and right cranks and left and right connecting plates, the left and right cranks are both rotatably connected to the middle support structure, the left and right connecting plates are respectively rotatably connected to the left and right cranks and respectively slidably connected to the left and right support frames, and the left and right connecting plates are respectively provided with connecting positions of left and right housings of the flexible screen terminal;

positions of rotation centers of the left crank and the left support frame are configured such that in the course that the flexible screen terminal is unfolded to folded, the left connecting plate moves toward a direction far away from the middle support structure, and in the course from being folded to unfolded, the left connecting plate moves toward the middle support structure;

positions of rotation centers of the right crank and the right support frame are configured such that in the course that the flexible screen terminal is unfolded to folded, the right connecting plate moves toward a direction far away from the middle support structure, and in the course from being folded to unfolded, the right connecting plate moves toward the middle support structure; and further, rotation centers of the left and right cranks are both higher than the flexible screen support surface of the middle support structure and are close to or at a height in a position where a flexible screen is neither extended nor shortened when being bent and unfolded in a thickness direction of the flexible screen.

2. The motion mechanism applied to the inner folding flexible screen terminal according to claim 1, wherein the motion mechanism is also provided with left and right movable support plates, the left and right movable support plates are respectively rotatably connected to left and right sides of the upper side of the middle support structure; and the left and right movable support plates are also respectively movably connected to the left and right support frames, and provide support for the left and right movable support plates when the flexible screen terminal is unfolded.

3. The motion mechanism applied to the inner folding flexible screen terminal according to claim 1, wherein the motion mechanism is also provided with the left and right movable support plates, outer side ends of the left and right cranks respectively extend below the left and right movable support plates, the left and right connecting plates are also respectively below the left and right movable support plates.

4. The motion mechanism applied to the inner folding flexible screen terminal according to claim 1, wherein rotation centers of the left and right support frames are lower than the flexible screen support surface;

positions of the rotation centers of the left and right support frames in left and right directions are closer to the middle line of the middle support structure than the rotation centers of the left and right cranks.

5. The motion mechanism applied to the inner folding flexible screen terminal according to claim 1, wherein slidable guide structures are arranged between the left support frame and the left connecting plate and between the right support frame and the right connecting plate.

6. The motion mechanism applied to the inner folding flexible screen terminal according to claim 5, wherein the slidable guide structures comprise guide shafts and guide sleeves matched with the guide shafts.

7. The motion mechanism applied to the inner folding flexible screen terminal according to claim 1, wherein the motion mechanism is also provided with a structure for increasing resistance when the flexible screen terminal is rotatably unfolded and folded.

8. The motion mechanism applied to the inner folding flexible screen terminal according to claim 5, wherein the motion mechanism is also provided with the structure for increasing the resistance when the flexible screen terminal is rotatably unfolded and folded; the structure for increasing the resistance is arranged at the slidable guide structures, to provide friction resistance for forward and backward sliding.

9. The motion mechanism applied to the inner folding flexible screen terminal according to claim 8, wherein the guide structures comprise guide shafts and guide sleeves matched with the guide shafts, the structure for increasing the resistance comprises reed pipes, the reed pipes are respectively connected to the left and right connecting plates, the guide shafts are connected to the left and right support frames, and the reed pipes tightly clamp the guide shafts.

10. An inner folding flexible screen terminal, comprising a flexible screen, left and right housings and the motion mechanism applied to the inner folding flexible screen terminal of claim 1, wherein the left housing is connected to the left connecting plate, the right housing is connected to the right connecting plate, the flexible screen is fixedly connected to the left and right housings respectively, and the flexible screen is supported by support plates in the left and right housings on both sides when the flexible screen terminal is unfolded.

\* \* \* \* \*